(12) United States Patent
Wu et al.

(10) Patent No.: US 12,550,378 B2
(45) Date of Patent: Feb. 10, 2026

(54) IGZO THIN-FILM TRANSISTOR AND METHOD FOR MANUFACTURING SAME

(71) Applicants: SOUTHEAST UNIVERSITY, Jiangsu (CN); CSMC TECHNOLOGIES FAB2 CO., LTD., Wuxi (CN)

(72) Inventors: Wangran Wu, Wuxi (CN); Guangan Yang, Wuxi (CN); Feng Lin, Wuxi (CN); Guipeng Sun, Wuxi (CN); Yaohui Wang, Wuxi (CN); Weifeng Sun, Wuxi (CN); Longxing Shi, Wuxi (CN)

(73) Assignees: SOUTHEAST UNIVERSITY, Jiangsu (CN); CSMC TECHNOLOGIES FAB2 CO., LTD., Wuxi (CN)

( * ) Notice: Subject to any disclaimer, the term of this patent is extended or adjusted under 35 U.S.C. 154(b) by 811 days.

(21) Appl. No.: 17/767,333

(22) PCT Filed: Aug. 26, 2020

(86) PCT No.: PCT/CN2020/111426
§ 371 (c)(1),
(2) Date: Apr. 7, 2022

(87) PCT Pub. No.: WO2021/068672
PCT Pub. Date: Apr. 15, 2021

(65) Prior Publication Data
US 2022/0367722 A1 Nov. 17, 2022

(30) Foreign Application Priority Data
Oct. 8, 2019 (CN) .......................... 201910949865.5

(51) Int. Cl.
*H10D 30/67* (2025.01)
*H01L 21/02* (2006.01)
*H10D 30/01* (2025.01)

(52) U.S. Cl.
CPC ... *H10D 30/6755* (2025.01); *H01L 21/02565* (2013.01); *H01L 21/02628* (2013.01); *H10D 30/031* (2025.01)

(58) Field of Classification Search
CPC ........... H01L 29/7869; H01L 21/02565; H01L 21/02628; H01L 29/66742; H01L 21/34;
(Continued)

(56) References Cited

U.S. PATENT DOCUMENTS

| | | | |
|---|---|---|---|
| 11,362,215 B2* | 6/2022 | Sharma | H01L 29/4908 |
| 2015/0123115 A1* | 5/2015 | Kim | H01L 21/02628 257/43 |
| 2019/0305133 A1 | 10/2019 | Sharma et al. | |

FOREIGN PATENT DOCUMENTS

| | | |
|---|---|---|
| CN | 102117767 | 7/2011 |
| CN | 103311128 | 9/2013 |

(Continued)

OTHER PUBLICATIONS

B. Park et al., "Solution-Processed Rad-Hard Amorphous Metal-Oxide Thin-Film Transistors," Advanced Functional Materials, vol. 28, No. 47, p. 1802717, Oct. 2018. (Year: 2018).*

(Continued)

*Primary Examiner* — Samuel A Gebremariam
(74) *Attorney, Agent, or Firm* — Dority & Manning, PA

(57) ABSTRACT

An IGZO thin-film transistor and a method for manufacturing same. The method includes: acquiring a substrate; forming an IGZO layer on the substrate by a solution process; doping V impurities on a surface of the IGZO layer by a spin doping process; forming a source electrode at one side of the IGZO layer, and forming a drain electrode at the other side; forming a gate dielectric layer on the doped IGZO layer; and forming a gate electrode on the gate dielectric layer.

16 Claims, 2 Drawing Sheets

(58) Field of Classification Search
CPC ... H10D 30/6755; H10D 30/031; H10D 86/42
See application file for complete search history.

(56) References Cited

FOREIGN PATENT DOCUMENTS

| CN | 103311128 | A | * | 9/2013 | ........... H01L 21/336 |
| CN | 107579005 | | | 1/2018 | |
| CN | 107579005 | A | * | 1/2018 | ....... H01L 21/02488 |
| CN | 109378274 | | | 2/2019 | |
| CN | 109378274 | A | * | 2/2019 | ......... H01L 29/0684 |

OTHER PUBLICATIONS

Y. Gao, J. Zhang and X. Li, "Solution-Processed Zirconium Oxide Gate Insulators for Top Gate and Low Operating Voltage Thin-Film Transistor," Journal of Display Technology, vol. 11, No. 9, pp. 764-767, Sep. 2015. (Year: 2015).*
Seokhyun Yoon, Si Joon Kim, Youn Jun Tak,& Hyan Jae Kim, A Solution-processed quaternary oxide system obtained at low-temperature using vertical diffusion technique, Feb. 23, 2017, Scientific Reports (Year: 2017).*
PCT International Search Report and Written Opinion (w/ English Translations) for corresponding Application No. PCT/CN2020/111426, mailed on Nov. 19, 2020, 13 pages.
Chinese Office Action for corresponding CN Application No. 201910949865.5, dated Oct. 9, 2021, 7 pages.
Chinese Office Action for corresponding CN Application No. 201910949865.5, dated Mar. 24, 2022, 5 pages.

* cited by examiner

IGZO THIN-FILM TRANSISTOR AND METHOD FOR MANUFACTURING SAME

CROSS REFERENCE TO RELATED APPLICATIONS

This application is a national stage of International Application No. PCT/CN2020/111426, filed on Aug. 26, 2020, and entitled "IGZO THIN-FILM TRANSISTOR AND METHOD FOR MANUFACTURING SAME," which claims priority to Chinese Patent Application No. 201910949865.5, filed on Oct. 8, 2019, and entitled "IGZO THIN-FILM TRANSISTOR AND METHOD FOR MANUFACTURING SAME," the contents of both of which are incorporated herein by reference in their entireties.

TECHNICAL FIELD

The present disclosure relates to the field of semiconductor manufacturing, and more particularly, to an indium gallium zinc oxide (IGZO) thin film transistor and a method for manufacturing the same.

BACKGROUND

Flexible electronics is an emerging electronic technology that manufactures electronic devices of organic or inorganic materials on flexible substrates. It has the characteristics of flexibility and high-efficiency and low-cost manufacturing processes, and has wide application prospects in the fields of information, energy, medical care, and national defense. Among flexible thin film materials, indium gallium zinc oxide (IGZO) thin film transistors have the advantages of high mobility, high on/off current ratio, and the like. High-mobility IGZO thin film transistors are one of the key technologies for manufacturing high-resolution displays, and have been commercially applied.

SUMMARY

Based on this, it is necessary to provide an IGZO thin film transistor with high working current density and a method for manufacturing the same.

A method for manufacturing an IGZO thin film transistor includes: acquiring a substrate; forming an IGZO layer on the substrate by a solution process; doping group V impurities in a surface of the IGZO layer by a spin-on dopant process; forming a source electrode on one side of the IGZO layer and forming a drain electrode on the other side of the IGZO layer, and forming a gate dielectric layer on the doped IGZO layer; and forming a gate electrode on the gate dielectric layer.

An IGZO thin film transistor includes: a substrate; a IGZO layer provided on the substrate, the IGZO layer being formed by a solution process, the IGZO layer comprising a channel region, a surface of the channel region being doped with group V impurities by a spin-on dopant process; a source electrode formed on one side of the IGZO layer; a drain electrode formed on the other side of the IGZO layer; a gate dielectric layer formed on the IGZO layer; and a gate electrode formed on the gate dielectric layer.

The details of one or more embodiments of the present disclosure are set forth in the accompanying drawings and description below. Other features, purposes and advantages of the present disclosure will become apparent from the description, the accompanying drawings, and the claims.

BRIEF DESCRIPTION OF THE DRAWINGS

To better describe and illustrate the embodiments and/or examples of the disclosure disclosed herein, reference may be made to one or more accompanying drawings. The additional details or examples used to describe the accompanying drawings are not to be construed as limiting the scope of any one of the disclosed disclosure, the presently described embodiments and/or examples, and the presently understood preferred mode of the disclosure.

DETAILED DESCRIPTION OF THE EMBODIMENTS

Figure 1:
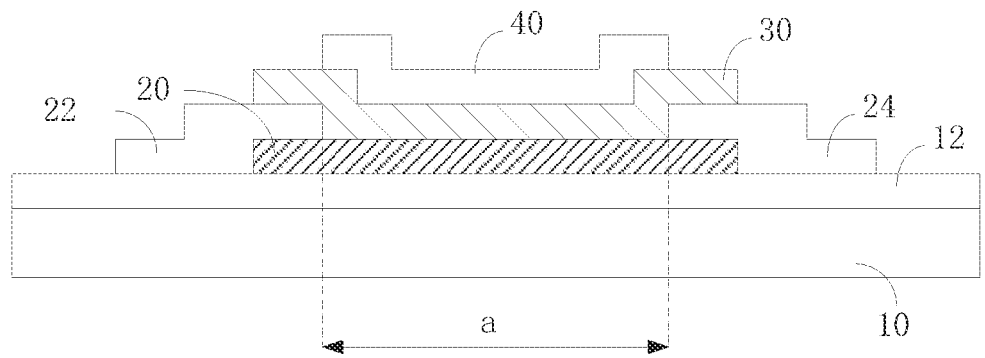
FIG. 1 is a schematic diagram of an IGZO thin film transistor in an embodiment.

In order to facilitate the understanding of the present disclosure, the present disclosure will be described more fully hereinafter with reference to the related accompanying, drawings. Preferable embodiments are presented in the accompanying drawings. However, the present disclosure may be embodied in many different forms and is not limited to the embodiments described herein. Rather, the purpose of providing these embodiments is to make the present disclosure more thorough and comprehensive.

Unless otherwise defined, all technical and scientific terms used herein have the same meaning as commonly understood by a person skilled in the art to which the present disclosure belongs. The terms used in the specification of the disclosure herein are for the purpose of describing specific embodiments only and are not intended to limit the present disclosure. The term "and/or" used herein includes any and all combinations of one or more of the associated listed items.

It should be understood that, when an element or layer is described as being "on", "adjacent to", "connected to" or "coupled to" another element or layer, it can be directly on, adjacent to, connected to, or coupled to the other element or layer, or there can be an intermediate element. In contrast, when an element is described as being "directly on", "directly adjacent to", "directly connected to", or "directly coupled to" another element or layer, there is no intermediate element or layer. It should be understood that, although the terms of "first", "second", "third", and so on can be used to describe various elements, components, regions, layers and/or portions, these elements, components, regions, layers and/or portions should not be limited by these terms. These terms are merely used to distinguish an element, component, region, layer or portion from another element, component, region, layer or portion. Thus, the first element, component, region, layer or portion discussed below can be described as a second element, component, region, layer or portion without departing from the teachings of the present disclosure.

Spatial relation terms such as "below", "beneath", "under", "above", "on", etc., can be used herein for convenience of description to describe the relationship between an element or feature and another element or feature shown in the figures. It should be understood that, in addition to the orientations shown in the figures, the spatial relationship terms are intended to include different orientations of the devices in use and operation. For example, if a device in the figures is turned over, then the element or feature described as "below" or "beneath" another element or feature would then be oriented as "above" the other element or feature. Thus, the exemplar terms "below" and "beneath" can include both orientations of above and below. The device may be otherwise oriented (rotated 90 degrees or otherwise) and the spatial descriptions used herein are interpreted accordingly.

Terms used herein are for the purpose of describing specific embodiments only and are not intended to be limiting of the present disclosure. As used herein, "a", "one" and "said/the" in singular forms are also intended to include a plural form unless the context clearly indicates other forms. It should also be understood that the terms "consist" and/or "include" when used in the description, determine presence of the features, integers, steps, operations, elements and/or components, but do not exclude the presence or addition of one or more other features, integers, steps, operations, elements, components, and/or groups. As used herein, the terms "and/or" include any and all combinations of related listed items.

The embodiments of the present disclosure are described here with reference to cross-sectional views which are schematic diagrams of ideal embodiments (and intermediate structures) of the present disclosure. In this way, changes from the shown shape due to, for example, manufacturing technology and/or tolerances can be expected. Therefore, the embodiments of the present disclosure should not be limited to the specific shapes of the regions shown here, but include shape deviations due to, for example, manufacturing. For example, an implanted region shown as a rectangle usually has round or curved features and/or implant concentration gradients at its edges, rather than a binary change from an implanted region to a non-implanted region. Likewise, a buried region formed by the implantation may result in some implantation in the region between the buried region and the surface passed through when the implantation is performed. Therefore, the regions shown in the figures are substantially schematic, and their shapes are not intended to show the actual shape of the regions of the device and are not intended to limit the scope of the present disclosure.

The terms of semiconductor field used herein are technical terms commonly used by those skilled in the art. For example, for P-type and N-type impurities, in order to distinguish the doping concentration, P+ type represents P-type with heavy doping concentration, P type represents P-type with medium doping concentration, and P− type represents P-type with light doping concentration, N+ type represents N-type with heavy doping concentration, N type represents N-type with medium doping concentration, and N− type represents N-type with light doping concentration.

For an exemplary preparation process of IGZO thin film solution, the composition ratio of the precursor solution is controlled to adjust the composition ratio of ions, such as increasing the content of In ions, which can increase the mobility and current density of the thin film. However, increasing the ratio of In ions means decreasing the ratio of Ga and Zn ions, which leads to an increase in oxygen vacancies and a decrease in the stability of the structure of the thin film. To achieve a joint improvement between current density and structural stability has become a difficult problem in the IGZO thin film solution process.

With the continuous development of academia and industry, a variety of methods have been proposed to increase the current density of α-IGZO thin films. These methods mainly include: 1) methods to increase the carrier concentration of the α-IGZO thin film, such as $NH_3$ plasma treatment to increase the concentration of hydrogen (H) ions, fluorine (F) ion implantation to increase the number of free electrons outside the nucleus, etc.; 2) sputtering in nitrogen ($N_2$) atmosphere to generate α-IGZO thin film, so that N ions are used to fill oxygen vacancies, and the Ga—N bond is more stable, thereby improving the stability of the structure of the α-IGZO thin film. However, the above methods have disadvantages such as complicated process, difficult operation, high cost, and easy to cause interface damage to the thin film. The inventor believes that the transport of the carriers of the α-IGZO thin film is mainly concentrated on the surface of the thin film, which requires extremely high properties for the surface of the thin film. A common disadvantage of the above methods is that it is easy to cause damages (such as interface defects and interface states) to the surface of the thin film, which severely restricts the improvement of the performance of the α-IGZO thin film.

Figure 2:
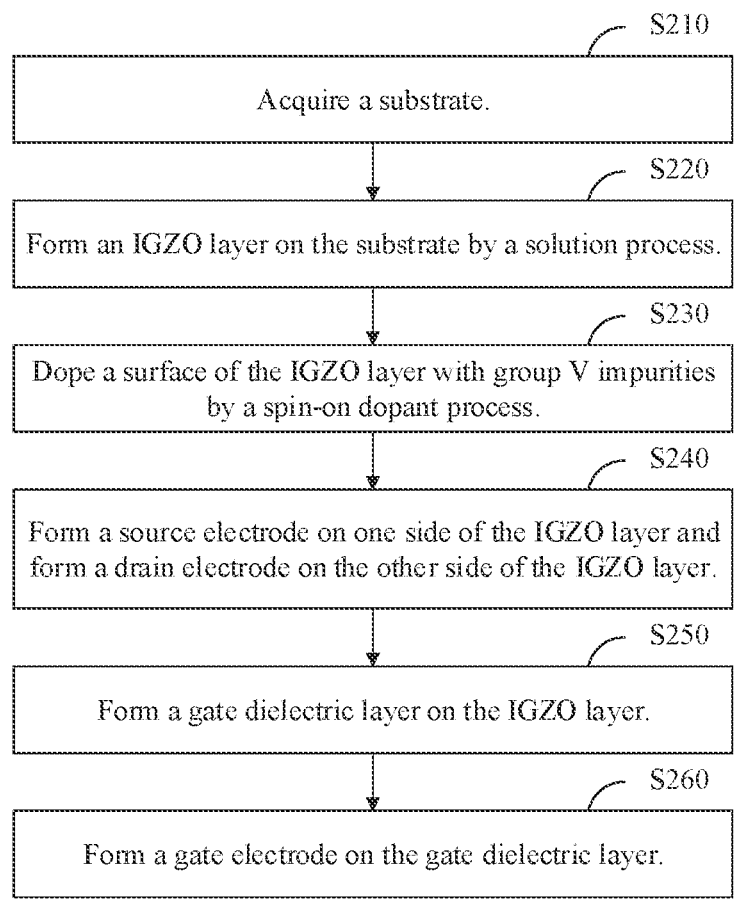
FIG. 2 is a flow chart of a method for manufacturing an IGZO thin film transistor in an embodiment.

FIG. 1 is a schematic diagram of an IGZO thin film transistor in an embodiment. FIG. 2 is a flow chart of a method for manufacturing an IGZO thin film transistor in an embodiment, and the method can be used to manufacture the IGZO thin film transistor shown in FIG. 1, which includes the following steps.

In S210, a substrate is acquired.

The substrate may be a rigid substrate (for example, glass) or a flexible substrate known in the art. In an embodiment, the substrate is a semiconductor substrate, such as a silicon substrate.

In S220, an IGZO layer is formed on the substrate by a solution process.

In an embodiment, a silicon dioxide layer may be formed by oxidation on the silicon substrate, and then an IGZO layer may be formed on the silicon dioxide layer.

In S230, group V impurities are doped in a surface of the IGZO layer by a spin-on dopant process.

The spin-on dopant (SOD) process is also a solution process, so compared with high-energy processes such as ion implantation, sputtering, and plasma treatment, it will not cause damage to the surface of the IGZO layer. In this embodiment, the doping is performed on the entire surface of the IGZO in step S230. The doping of the group V impurities can increase the concentration of channel carriers, thereby increasing the working current density of the device. For the embodiments in which only a part of the area of the IGZO layer is used as the conductive channel, only the surface of the channel region of the IGZO layer may be doped under the premise that the used process allows.

In S240, a source electrode is formed on one side of the IGZO layer and a drain electrode is formed on the other side of the IGZO layer.

In this embodiment, after step S230, a tin-doped indium oxide (ITO) source electrode and ITO drain electrode are formed on two sides of the IGZO layer, respectively, and the ITO source electrode and ITO drain electrode extend from the two sides of the IGZO layer onto the substrate (in this embodiment, they extend onto the silicon dioxide layer of the substrate). In other embodiments, the source electrode and drain electrode may also be made of other source and drain materials/structures known in the art. In an embodiment, after step S220, step S240 may also be performed first and then step S230 is performed.

In S250, a gate dielectric layer is formed on the IGZO layer.

In this embodiment, the gate dielectric layer covers the surface of the channel region of the IGZO layer and extends onto the ITO source electrode and the ITO drain electrode on two sides of the IGZO layer. In other embodiments, the gate dielectric layer may not extend to the source electrode and the drain electrode. In an embodiment, the gate dielectric layer is made of aluminum oxide ($Al_2O_3$).

In S260, a gate electrode is formed on the gate dielectric layer.

In this embodiment, steps S230 and S260 are performed after step S240. In other embodiments, step S240 may also be performed after step S260. In an embodiment, the gate electrode is an ITO gate electrode; in other embodiments, the gate electrode may also be made of other gate materials known in the art.

In the above-described method for manufacturing the IGZO thin film transistor, the IGZO layer is formed by the solution process, and the group V impurities are doped in the surface of the channel region of the IGZO layer by the spin-on dopant process. Therefore, the entire IGZO layer is prepared by the solution process, which is easy to operate and has low cost, and mass production can be achieve by combining with roll-to-roll process and printed electronics technology. Doping the group V impurities in the surface of the channel region can increase the concentration of the channel carriers, thereby increasing the working current density (channel current density) of the device. In addition, since the solution process is adopted for the doping, it will not cause damage to the surface of the IGZO layer compared to processes such as ion implantation. Since the transport of carriers of the α-IGZO thin film is mainly concentrated on the surface of the thin film, compared with doping the channel region by ion implantation and other processes, this solution can significantly reduce the on-resistance of the α-IGZO thin film transistor and improve the mobility of the channel carriers of the thin film.

In an embodiment, the IGZO layer formed by the above method is an α-IGZO (amorphous IGZO) thin film.

In an embodiment, the preparations in steps S240, S250, and S260 are also performed by solution process, so that the α-IGZO thin film transistor can be prepared by full solution process, which is easy to operate and has low cost, and mass production can be achieve by combining with roll-to-roll process and printed electronics technology.

In an embodiment, the dopant used in step S230 contains phosphorus element. In other embodiments, the dopant may also contain other group V elements, such as arsenic element.

In an embodiment, after step 230, the method further includes steps of performing a drying treatment and an ultraviolet annealing treatment on the IGZO layer. Specifically, the substrate on which the IGZO layer is formed can be dried on a heating table, the temperature of the heating table can be set to 200° C., and the doped impurities can be ion-activated by combining with UV-Light low temperature annealing technology.

Figure 3:
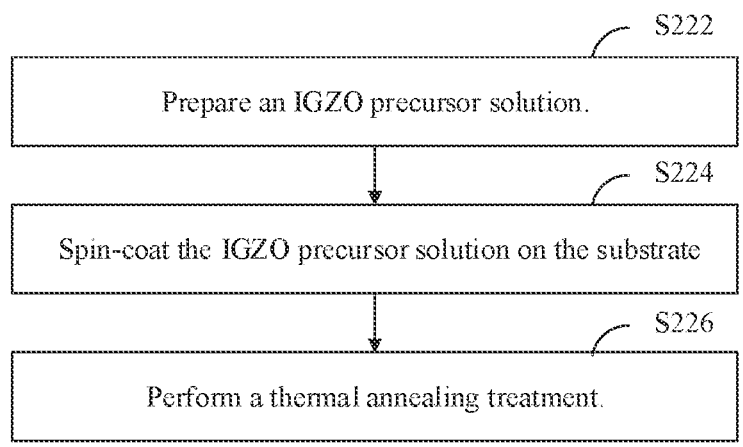
FIG. 3 is a flow chart of sub-steps of step S220 in an embodiment.

Referring to FIG. 3, in an embodiment, the step S220 includes:

In S222, an IGZO precursor solution is prepared.

In an embodiment, indium (III) nitrate hydrate (In$(NO_3)_3 \cdot xH_2O$), zinc nitrate hydrate ($Zn(NO_3)_3 \cdot xH_2O$), and gallium (III) nitrate hydrate ($Ga(NO_3)_3 \cdot xH_2O$) are dissolved in 2-methoxyethanol ($CH_3OCH_2CH_2OH$) solvent and stirred, and then the stirred liquid is filtered to obtain the IGZO precursor solution.

In an embodiment, in step S222, specifically, indium (III) nitrate hydrate (In$(NO_3)_3 \cdot xH_2O$), zinc nitrate hydrate ($Zn(NO_3)_3 \cdot xH_2O$), and gallium (III) nitrate hydrate (Ga$(NO_3)_3 \cdot xH_2O$) at a molar ratio of 6:1:1 are dissolved in 2-methoxyethanol ($CH_3OCH_2CH_2OH$) solvent in an indoor environment, and stirred quickly with a blender for 12 hours or more, and then filtered by a polytetrafluoroethylene (PTFE) filter having a thickness of 0.2 μm, in this way, the preparation of the α-IGZO precursor solution is completed.

In S224, the IGZO precursor solution is spin-coated on the substrate.

In an embodiment, the α-IGZO precursor solution is spin-coated on the substrate and rotated at a speed of 3500 RPM (revolutions per minute) for 60 seconds.

In S226, a thermal annealing treatment is performed.

In an embodiment, the substrate spin-coated with the IGZO precursor solution is annealed at a temperature of 300° C. for 30 minutes.

The present disclosure further provides an IGZO thin film transistor, the IGZO thin film transistor can be manufactured by the manufacturing method of any one of the above embodiments. As shown in FIG. 1, the IGZO thin film transistor includes a substrate 10, an IGZO layer 20, a source electrode 22, a drain electrode 24, a gate dielectric layer 30, and a gate electrode 40. The substrate 10 may be a rigid substrate (such as glass) or a flexible substrate known in the art. In an embodiment, the substrate is a semiconductor substrate, such as a silicon substrate. In the embodiment shown in FIG. 1, the IGZO thin film transistor adopts a structure of top-gate/top-contact. It should be noted that the size of each film layer in FIG. 1 is only an illustration, and does not represent its actual size.

The IGZO layer 20 is provided on the substrate. In the embodiment shown in FIG. 1, the IGZO layer 20 includes a channel region a. The IGZO layer 20 is formed by a solution process, and the surface of the channel region a is doped with group V impurities by a spin-on dopant process.

The source electrode 22 is formed on one side of the IGZO layer 20 and the drain electrode 24 is formed on the other side of the IGZO layer 20. In the embodiment shown in FIG. 1, the source electrode 22 is an ITO source electrode and the drain electrode 24 is an ITO drain electrode. In other embodiments, the source electrode and drain electrode may also be made of other source and drain materials/structures known in the art.

The gate dielectric layer 30 is formed on the IGZO layer 20. In the embodiment shown in FIG. 1, the source electrode 22 and the drain electrode 24 both extend from the surface of the substrate on two sides of the IGZO layer 20 onto the IGZO layer 20. The gate dielectric layer 30 covers the channel region a and extends onto the source electrode 22 and the drain electrode 24. The gate electrode 40 is formed on the gate dielectric layer 30. In an embodiment, the gate dielectric layer 30 is made of aluminum oxide ($Al_2O_3$). In an embodiment, the gate electrode 40 is an ITO gate electrode.

In an embodiment, the IGZO layer 20 is an α-IGZO thin film. When the IGZO thin film transistor works, the gate electrode 40 is connected to a positive voltage, and negative charges are accumulated and formed in the channel of the α-IGZO thin film, and the drain electrode 24 is electrified to perform transport of carriers to form current.

In the embodiment shown in FIG. 1, the IGZO thin film transistor further includes an insulating oxide layer 12 provided on the substrate 10, in an embodiment, the insulating oxide layer 12 is made of silicon dioxide.

In the embodiment shown in FIG. 1, the IGZO layer 20 has a thickness of 100 nm, the source electrode 22 and the drain electrode 24 each have a thickness of 40 nm (the thickness of the source/drain electrode on the IGZO layer 20), the gate dielectric layer 30 has a thickness of 200 nm, the gate electrode 40 has a thickness of 40 nm, and the channel region a has a length of 100 μm.

In an embodiment, the group V impurities doped in the channel region a are phosphorous ions. Specifically, the concentration of the doped phosphorus ions may be 1e16 $cm^{-3}$.

Figure 4:
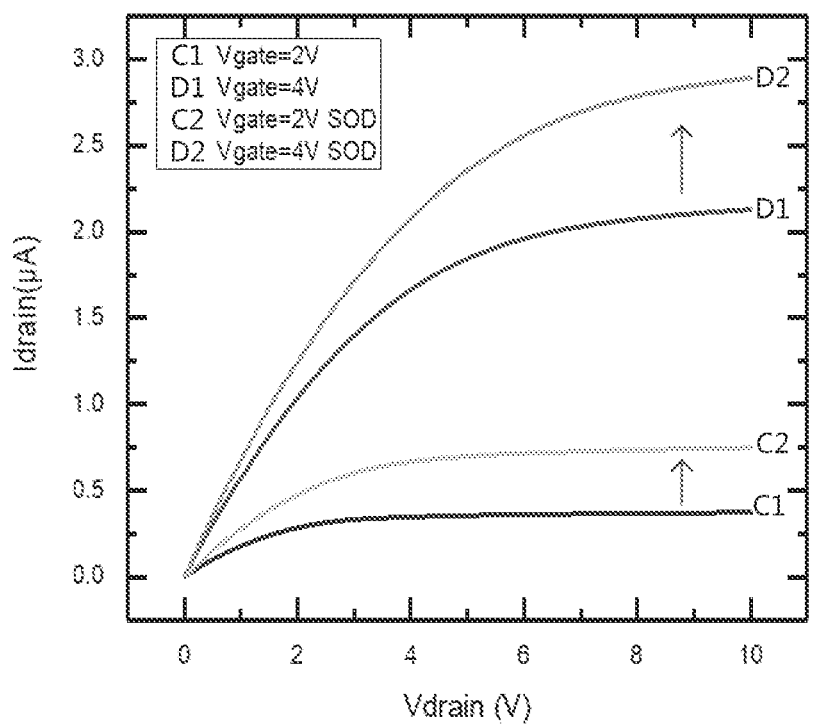
FIG. 4 is a graph showing currents of drain electrodes of IGZO thin film transistors according to an embodiment of the present disclosure and a comparative example.

FIG. 4 is a graph showing currents of drain electrodes of IGZO thin film transistors according to an embodiment of the present disclosure and a comparative example. The comparative example is an IGZO thin film transistor in which the channel region of the IGZO layer is not doped with group V impurities. In FIG. 4, the abscissa is the voltage of the drain electrode and the ordinate is the current of the drain electrode. Curve C1 is a curve of the current of the drain electrode of the comparative example when the voltage of the gate electrode is 2 volts, and curve C2 is a curve of the current of the drain electrode of the embodiment of the present disclosure when the voltage of the gate electrode is 2 volts; and curve D1 is a curve of the current of the drain electrode of the comparative example when the voltage of the gate electrode is 4 volts, and curve D2 is a curve of the current of the drain electrode of the embodiment of the present disclosure when the voltage of the gate electrode is 4 volts. It can be seen that the output performance (current of the drain electrode) of the α-IGZO thin film transistor is significantly improved after the spin-coating doping.

The above described embodiments are merely illustrate several embodiments of the present disclosure, which are described more specifically and in detail, but they cannot be understood as limiting the scope of the present disclosure. It should be noted that, for those ordinary skilled in the art, several variations and improvements may be made without departing from the concept of the present disclosure, and all of which are within the protection scope of the present disclosure. Therefore, the protection scope of the present disclosure shall be defined by the appended claims.

What is claimed is:

1. A method for manufacturing an indium gallium zinc oxide (IGZO) thin film transistor, comprising:
    acquiring a substrate;
    forming an IGZO layer on the substrate by a solution process;
    forming a source electrode on one side of the IGZO layer and forming a drain electrode on the other side of the IGZO layer, the source electrode and the drain electrode respectively covering the two sides of the IGZO layer and extending from the two sides of the IGZO layer onto the substrate;
    doping an impurity of P, As, Sb or Bi in a surface of a channel region of the IGZO layer between the source electrode and the drain electrode by a spin-on dopant process;
    after the doping, forming a gate dielectric layer covering the surface of the channel region of the IGZO layer and extending onto the source electrode and the drain electrode on two sides of the IGZO layer; and
    forming a gate electrode on the gate dielectric layer.

2. The method according to claim 1, wherein a dopant used in the step of doping the impurity of P, As, Sb or Bi in the surface of the channel region of the IGZO layer by the spin-on dopant process contains phosphorus or arsenic.

3. The method according to claim 1, wherein the step of forming the IGZO layer on the substrate by the solution process comprises:
    preparing an IGZO precursor solution; and
    spin-coating the IGZO precursor solution on the substrate.

4. The method according to claim 3, further comprising a step of performing a thermal annealing treatment on the substrate spin-coated with the IGZO precursor solution.

5. The method according to claim 3, wherein the step of preparing the IGZO precursor solution comprises:
    dissolving indium nitrate hydrate, zinc nitrate hydrate, gallium nitrate hydrate in 2-methoxyethanol solvent and stirring; and
    filtering the stirred liquid to obtain the IGZO precursor solution.

6. The method according to claim 5, wherein the filtration is performed using a polytetrafluoroethylene filter membrane having a thickness of 0.2 μm.

7. The method according to claim 5, wherein in the step of dissolving indium nitrate hydrate, zinc nitrate hydrate, gallium nitrate hydrate in 2-methoxyethanol solvent, a molar ratio of indium nitrate hydrate, zinc nitrate hydrate, and gallium nitrate hydrate is 6:1:1.

8. The method according to claim 1, wherein after the step of doping the impurity of P, As, Sb or Bi in the surface of the channel region of the IGZO layer by the spin-on dopant process, the method further comprises steps of performing a drying treatment and an ultraviolet annealing treatment on the doped IGZO layer.

9. The method according to claim 1, wherein the step of forming the source electrode on one side of the IGZO layer and forming the drain electrode on the other side of the IGZO layer, and forming the gate dielectric layer, and the step of forming the gate electrode on the gate dielectric layer are prepared by a solution process.

10. The method according to claim 3, wherein the step of spin-coating the IGZO precursor solution on the substrate comprises: spin-coating an amorphous IGZO precursor solution on the substrate and rotating at a speed of 3,500 revolutions per minute for 60 seconds.

11. The method according to claim 4, wherein the step of performing the thermal annealing treatment on the substrate spin-coated with the IGZO precursor solution comprises: annealing the substrate spin-coated with the IGZO precursor solution at a temperature of 300° C. for 30 minutes.

12. An IGZO thin film transistor, comprising:
    a substrate;
    an IGZO layer provided on the substrate, the IGZO layer being formed by a solution process and comprising a channel region between a source electrode and a drain electrode,
    the source electrode covering and extending from one side of the IGZO layer onto the substrate;
    the drain electrode covering and extending from the other side of the IGZO layer onto the substrate;
    a surface of the channel region between the source electrode and the drain electrode being doped with an impurity of P, As, Sb or Bi by a spin-on dopant process;
    a gate dielectric layer covering the surface of the channel region of the IGZO layer and extending onto the source electrode and the drain electrode on two sides of the IGZO layer; and
    a gate electrode formed on the gate dielectric layer.

13. The IGZO thin film transistor according to claim 12, wherein the substrate comprises a semiconductor substrate and an insulating oxide layer on the semiconductor substrate.

14. The IGZO thin film transistor according to claim 12, wherein the source electrode comprises an ITO source electrode covering one side edge of the IGZO layer, and the drain electrode comprises an ITO drain electrode partially covering the other side edge of the IGZO layer, the gate dielectric layer extends from a surface of the channel region of the IGZO layer onto the ITO source electrode and the ITO drain electrode, a material of the gate dielectric layer comprises aluminum oxide, and the gate electrode comprises an ITO gate electrode.

15. The IGZO thin film transistor according to claim 12, wherein the IGZO layer is an amorphous IGZO thin film.

16. A method for manufacturing an indium gallium zinc oxide (IGZO) thin film transistor, comprising:
   acquiring a substrate;
   forming an IGZO layer on the substrate by a solution process;
   forming a source electrode on one side of the IGZO layer and forming a drain electrode on the other side of the IGZO layer, the source electrode and the drain electrode respectively covering the two sides of the IGZO layer and extending from the two sides of the IGZO layer onto the substrate;
   doping an impurity of P, As, Sb or Bi in a surface of a channel region of the IGZO layer between the source electrode and the drain electrode by a spin-on dopant process;
   after the doping, forming a gate dielectric layer covering the surface of the channel region of the IGZO layer and extending onto the source electrode and the drain electrode on two sides of the IGZO layer; and
   forming a gate electrode on the gate dielectric layer;
   wherein after the step of doping the impurity of P, As, Sb or Bi in the surface of the channel region of the IGZO layer by the spin-on dopant process, the method further comprises steps of performing a drying treatment and an ultraviolet annealing treatment on the doped IGZO layer.

\* \* \* \* \*